(12) United States Patent
Kwon et al.

(10) Patent No.: US 8,736,156 B2
(45) Date of Patent: May 27, 2014

(54) ORGANIC LIGHT EMITTING DIODE DISPLAY

(75) Inventors: Oh-June Kwon, Yongin (KR); Seung-Yong Song, Yongin (KR); Young-Seo Choi, Yongin (KR); Ji-Hun Ryu, Yongin (KR); Kwan-Hee Lee, Yongin (KR); Min-Soo Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 337 days.

(21) Appl. No.: 13/064,156

(22) Filed: Mar. 8, 2011

(65) Prior Publication Data

US 2011/0221334 A1 Sep. 15, 2011

(30) Foreign Application Priority Data

Mar. 9, 2010 (KR) ........................ 10-2010-0020999

(51) Int. Cl.
*H01J 1/62* (2006.01)
*H01J 63/04* (2006.01)

(52) U.S. Cl.
USPC ......................................... 313/504; 313/506

(58) Field of Classification Search
USPC ................................. 313/498–512
See application file for complete search history.

(56) References Cited

U.S. PATENT DOCUMENTS

| 2004/0207314 A1* | 10/2004 | Aitken et al. ................ 313/504 |
| 2005/0179377 A1* | 8/2005 | Shitagami et al. ............ 313/512 |
| 2010/0033084 A1* | 2/2010 | Ko et al. ..................... 313/504 |
| 2011/0084290 A1* | 4/2011 | Nakamura et al. ............. 257/89 |

FOREIGN PATENT DOCUMENTS

| JP | 2007-042467 A | | 2/2007 |
| KR | 10-2005-0065828 A | | 6/2005 |
| KR | 10-2007-0072400 A | | 7/2007 |
| KR | 10-2007-0074828 A | | 7/2007 |
| KR | 10-2008-0087257 A | | 10/2008 |
| KR | 10 2010-0003243 A | | 1/2010 |
| KR | 10 2010-0081774 A | | 7/2010 |
| WO | WO2010004865 | * | 1/2010 |

* cited by examiner

*Primary Examiner* — Anh Mai
*Assistant Examiner* — Zachary J Snyder
(74) *Attorney, Agent, or Firm* — Lee & Morse, P.C.

(57) ABSTRACT

An organic light emitting diode display includes a first substrate, the first substrate including at least one organic light emitting diode and a pixel defining layer having an opening portion defining a light emitting region of the organic light emitting diode, protruding portions increasingly protruding on the pixel defining layer as the protruding portions approach the edges of the first substrate, a second substrate disposed opposite to the first substrate, a sealing member bonding the first substrate to the second substrate, and filler in a space between the first substrate and the second substrate.

11 Claims, 6 Drawing Sheets

FIG. 6

ORGANIC LIGHT EMITTING DIODE DISPLAY

BACKGROUND

1. Field

Embodiments relate to an organic light emitting diode display.

2. Description of the Related Art

An organic light emitting diode display has self-light emitting characteristic and does not need a separate light source unlike a typical liquid crystal display, thereby making it possible to reduce thickness and weight. Further, the organic light emitting diode display has good characteristics such as low power consumption, high luminance, and high reaction speed, etc., such that it has been of interest as the next generation display device for portable electronic devices. Generally, the organic light emitting diode display includes a display substrate having an organic light emitting diode (OLED), an encapsulation substrate that is disposed to be opposite to the display substrate and protect the organic light emitting diode display, and a sealing member that bonds the display substrate to the encapsulation substrate and seals them.

The above information disclosed in this Background section is only for enhancement of understanding of the background of the described technology and therefore it may contain information that does not form the prior art that is already known to a person of ordinary skill in the art.

SUMMARY

It is a feature of an embodiment to provide an organic light emitting diode display capable of smoothly filling filler by making a volume of spacers at edges of a display panel large.

At least one of the above and other features and advantages may be realized by providing an organic light emitting diode display, including a first substrate, the first substrate including at least one organic light emitting diode and a pixel defining layer having an opening portion defining a light emitting region of the organic light emitting diode, protruding portions increasingly protruding on the pixel defining layer as the protruding portions approach the edges of the first substrate, a second substrate disposed opposite to the first substrate, a sealing member bonding the first substrate to the second substrate, and filler in a space between the first substrate and the second substrate.

The protruding portions may be spacers configured to maintain an interval between the first substrate and the second substrate.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being disposed in a row direction or a column direction between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a cross shape between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a combination of a cross shape and a straight shape between the organic light emitting diodes.

The spacers may have a longer length as they approach the edges of the first substrate.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being disposed in a row direction or a column direction between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a cross shape between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a combination of a cross shape and a straight shape between the organic light emitting diodes.

The spacers may have a larger volume as they approach the edges of the first substrate.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being disposed in a row direction or a column direction between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a cross shape between the organic light emitting diodes.

The first substrate may include a plurality of organic light emitting diodes, the organic light emitting diodes being arranged in a plurality of rows and columns on the first substrate, and the spacers may include spacers having a first volume and spacers having a relatively larger volume than the first volume, the spacers having the relatively larger volume being formed in a combination of a cross shape and a straight shape between the organic light emitting diodes.

The protruding portions may be integrally formed with the pixel defining layer.

The sealing member may be frit.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2010-0020999 filed on Mar. 9, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
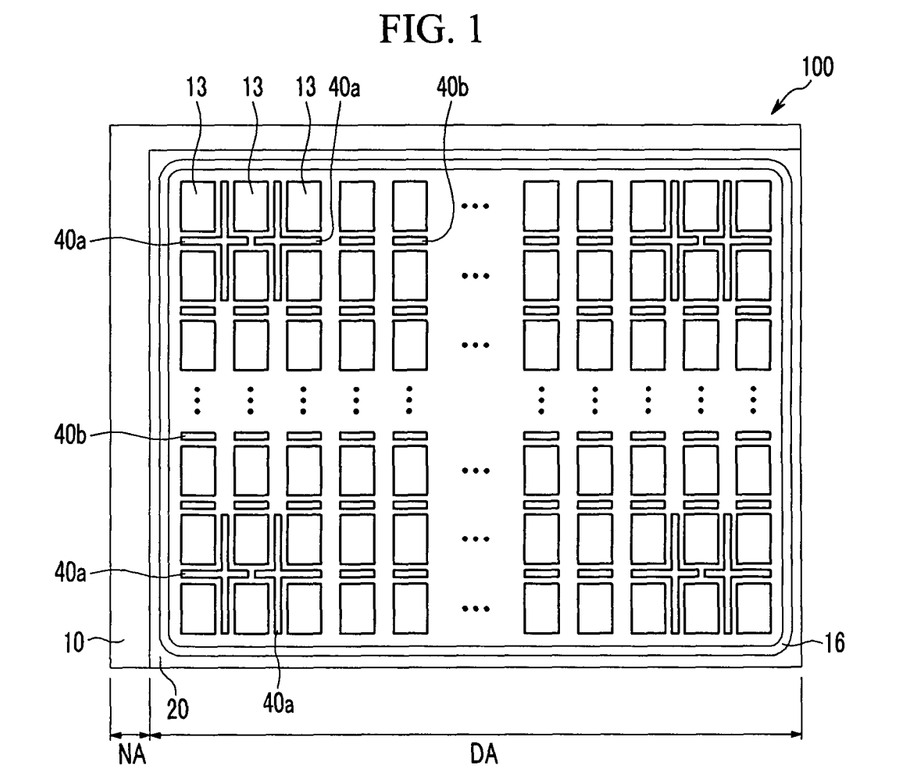
FIG. 1 illustrates a plan layout view of an organic light emitting diode display according to a first example embodiment.
Figure 2:
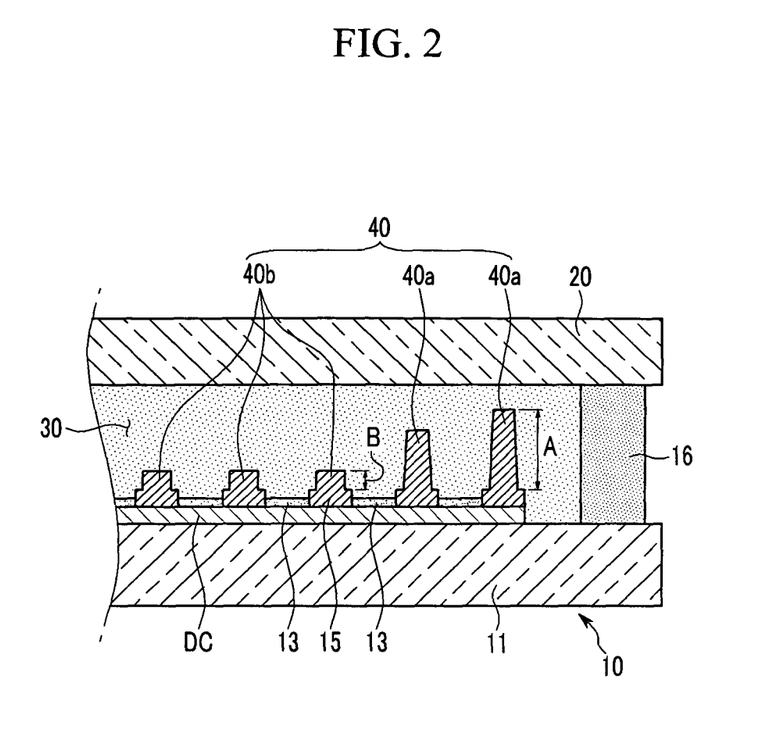
FIG. 2 illustrates a schematic cross-sectional view of an organic light emitting diode display according to an embodiment.

FIG. 1 illustrates a plan layout view of an organic light emitting diode display according to a first example embodiment. FIG. 2 illustrates a schematic cross-sectional view of an organic light emitting diode display according to an embodiment.

Referring to FIGS. 1 and 2, an organic light emitting diode display 100 according to an example embodiment may include a first substrate 10 (hereinafter, display substrate), a plurality of organic light emitting diodes (OLEDs) 13, a second substrate 20 (hereinafter, encapsulation substrate), a sealing member 16, filler 30, and a plurality of protruding portions 40a, 40b (collectively referred to as protruding portions 40). The display substrate 10 may include a display area (DA) and a mounting area (NA).

Referring to FIG. 2, the display substrate 10 may include a substrate main body 11, a driving circuit unit (DC) on the substrate main body 11, an organic light emitting diode 13, and a pixel defining layer 15. The driving circuit unit (DC) may be formed on the substrate main body 11.

The substrate main body 11 may be formed of, e.g., an insulating substrate made of glass, quartz, ceramic, plastic, etc. However, the first example embodiment is not limited thereto and the substrate main body 11 may be formed of a metallic substrate made of, e.g., stainless steel, etc.

Figure 3:
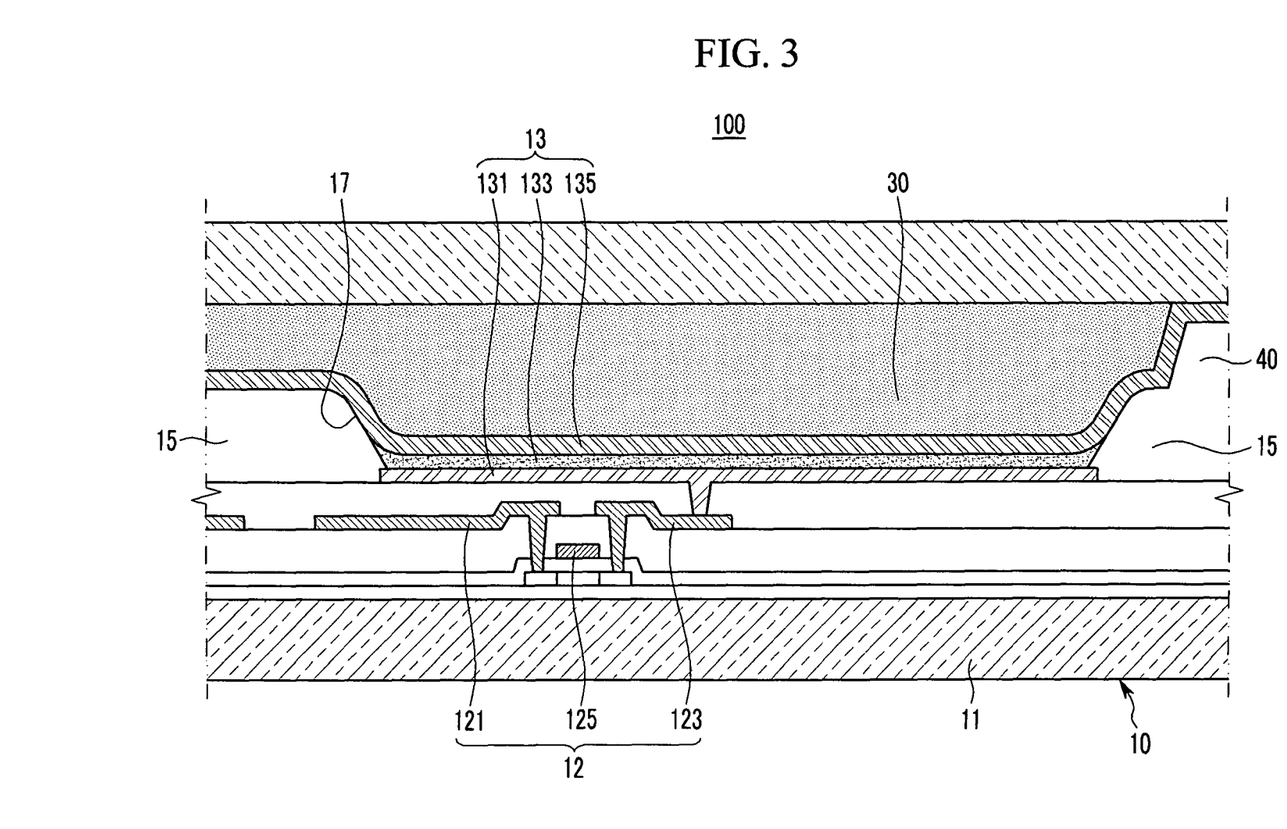
FIG. 3 illustrates an enlarged partial cross-sectional view of an organic light emitting diode display according to an embodiment.

FIG. 3 illustrates an enlarged partial cross-sectional view of an organic light emitting diode display according to an embodiment. Referring to FIG. 3, the driving circuit unit (DC) is disposed on the substrate main body 11. The driving circuit unit (DC) may include a thin film transistor 12 that includes a source electrode 121, a drain electrode 123, and a gate electrode 125. The thin film transistor 12 may drive the organic light emitting diode 13. Thus, the organic light emitting diode 13 may emit light according to driving signals transmitted from the driving circuit unit (DC), thereby displaying images.

As illustrated in FIG. 1, the encapsulation substrate 20 may be formed to have a size smaller than the display substrate 10 and may be bonded to the display area of the display substrate 10. The display substrate 10 and the encapsulation substrate 20 may be bonded to each other by the sealing member 16 along the edge of the encapsulation substrate 20.

One or more integrated circuit chips (not shown) may be mounted in the mounting area (NA) of the display substrate 10. The integrated circuit chip may be mounted on a surface that faces in the same direction as a surface attached to the encapsulation substrate 20 in the display substrate 10. Thus, the encapsulation substrate 20 and the integrated circuit chip may be disposed adjacent to each other.

The display substrate 10 may include a scan driver (not shown) and a data driver (not shown) that drive pixels. The display substrate 10 may further include pad electrodes (not shown) that are disposed in the mounting area (NA). The integrated circuit chip may be mounted in the mounting area (NA) of the display substrate 10 by, e.g., a chip on glass (COG) scheme, so that it is electrically connected to the pad electrode (not shown). The display substrate 10 may further include wires (not shown) by which the integrated circuit chip, the scan driver (not shown), and the data driver (not shown) are connected to each other.

As shown in FIG. 3, the encapsulation substrate 20 may be bonded to the display substrate 10 to seal and protect the organic light emitting diode 13, the thin film transistor 12, and several wires, etc., on the display substrate 10 from external elements, e.g., moisture, dirt, etc.

The filler 30 may be disposed in a space between the display substrate 10 and the encapsulation substrate 20. The filler 30 may fill the empty space between the display substrate 10 and the encapsulation substrate 20 to improve the mechanical strength of the organic light emitting diode display 100. Thus, the filler 30 may fill the empty space in the organic light emitting diode display 100, thereby improving durability against the external impact. The filler 30 may be transparent and may be made of, e.g., a silicon-based material.

A protruding portion 40 may be on the pixel defining layer 15, and may be integrally formed with the pixel defining layer 15. Referring to FIG. 3, the protruding portion 40 may be protruded from portions of the pixel defining layer 15, i.e., other than an opening 17 defining a light emitting region. In an example embodiment, the protruding portion 40 may serve as a spacer. Therefore, the same reference number 40 may refer to the protruding portion 40 and the spacer 40.

The spacers 40 may be formed on at least one of the display substrate 10 and the encapsulation substrate 20 to maintain the interval between the display substrate 10 and the encapsulation substrate 20, e.g., to protect the display substrate 10 in the event of an external impact. The present embodiment describes, by way of example, a case where the spacers 40 are integrally formed with the pixel defining layer 15 on the display substrate 10. Among the spacers 40, the spacers 40a refer to spacers positioned at edges of the display substrate 10, and spacers 40b refer spacers positioned at the central position of the display substrate 10.

In an organic light emitting diode display according to an embodiment, the volume of the spacers at four edges of the display substrate is made large, and/or multiple spacers are disposed at four edges of the display substrate, in order to prevent an empty space from occurring, i.e., to prevent a filling defect of the filler, and thereby improve the mechanical strength of the organic light emitting diode display. In an embodiment, the spacers 40 have a relatively larger volume as they approach the edges of the display substrate 10. The spacers having the relatively larger volume serve to prevent the diffusion defect of the filler 30 (which is filled between the display substrate 10 and the encapsulation substrate 20) at the edges of the display substrate 10.

During manufacture, the filler 30 may be dropped between the display substrate 10 and the encapsulation substrate 20, and may be diffused to fill between the display substrate 10 and the encapsulation substrate 20. However, it may not be easy to diffuse the filler 30 at the edges of the display substrate 10. Thus, a filling defect may occur. Therefore, according to an embodiment, the size of the space to be filled by the filler 30 at the edges of the display substrate 10 may be reduced by making the volume of the spacers 40a at the edges of the display substrate 10 larger than that of the spacers 40b of the central portion of the display substrate 10. This may reduce or prevent the occurrence of the empty space that is not filled due to the lack of the filler 30 at the edges of the display substrate 10, i.e., may reduce or prevent filling defects.

In the example embodiment, in order to make the volume of the spacer 40a at the edges of the display substrate 10 large, length A of the spacers 40a at the edges of the display substrate 10 may be longer than length B of the spacers 40b of the central position of the display substrate 10.

Referring again to FIG. 1, the organic light emitting diodes 13 may be arranged in a plurality of rows and columns on the display substrate 10. The spacers 40a at the edges of the display substrate 10 may be formed to have a cross shape between the organic light emitting diodes 13. For example, the spacers 40a may have a cross shape at each of four edges of the display substrate 10, such that the volume of each spacer 40a is relatively larger, thereby making it possible to prevent the filling defect of the filler 30. Thus, the volume of the spacers 40a may be made large to compensate for the empty space at the edges and/or corners of the display substrate 10.

The cross-shaped spacers 40a at the edges of the display substrate 10 may be formed to be relatively longer than the spacers 40b at the central position of the display substrate 10, as shown in FIG. 2. Although FIG. 1 shows that the spacers 40a at the edges of the display substrate 10 are disposed in a cross shape, they are not limited thereto and may be disposed in another arrangement, e.g., a combination of the cross shape and a straight shape.

The spacer 40 and the pixel defining layer 15 may be made of, e.g., a polyacrylate resin, a polyimide resin, etc., or silica-based inorganic materials and the like. The pixel defining layer 15 and the spacer 40 may be integrally formed, e.g., through a photo process or a photolithography process. For example, the pixel defining layer 15 and the spacer 40 may be formed together by controlling exposure through a halftone exposure process. However, the present embodiment is not limited thereto, and the pixel defining layer 15 and the spacer 40 may be formed sequentially or separately. Further, the pixel defining layer 15 and the spacer 40 may be made of different materials.

Referring again to FIG. 2, an organic light emitting layer 133 may be formed on a pixel electrode 131, and a common electrode 135 may be formed on the organic light emitting layer 133. The organic light emitting diode 13 may include the pixel electrode 131, the organic light emitting layer 133, and the common electrode 135. The organic light emitting layer 133 may be disposed adjacent to and between the pixel electrode 131 and the common electrode 135 in an opening part 17 of the pixel defining layer 15. The organic light emitting layer 113 may emit light. The common electrode 135 may be formed on the organic light emitting layer 133, the pixel defining layer 15, and the spacer 40.

The organic light emitting layer 133 may be made of, or may include, e.g., a low molecular organic material or a high molecular organic material. In addition, the organic light emitting layer 133 may be formed in a multilayer, which may include one or more of a light emitting layer, a hole-injection layer (HIL), a hole-transporting layer (HTL), and an electron-injection layer (EIL). When the multilayer includes all the layers described above, the hole-injection layer (HIL) may be disposed on the pixel electrode that is anode, and the hole-transporting layer (HTL), the light emitting layer, the electron-transporting layer (ETL), and the electron-injection layer (EIL) may be sequentially stacked thereon.

In FIG. 3, the organic light emitting layer 133 is disposed only in the opening portion 17 of the pixel defining layer 15, but the example embodiment is not limited thereto. For example, the organic light emitting layer 133 may be formed on the pixel electrode 131 in the opening portion 17 of the pixel defining layer 15, as well being disposed between the pixel defining layer 15 and the common electrode 135. In more detail, the organic light emitting layer 133 may be formed on the pixel electrode 131 as well as the pixel defining layer 15 using an open mask, similar to the common electrode 135, during a process of manufacturing the remaining hole-injection layer (HIL), hole-transporting layer (HTL), electron-transporting layer (ETL), and electron-injection layer (EIL) other than the light emitting layer among layers such as the hole-injection layer (HIL), the hole-transporting layer (HTL), and the electron-injection layer (EIL) together with the light emitting layer. Thus, one or more of several layers included with the organic light emitting layer 133 may be disposed between the pixel defining layer 15 and the common electrode 135.

The pixel electrode 131 and the common electrode 135 may each made of transparent conductive materials, or transflective or reflective conductive materials. The organic light emitting diode display 100 may be a top emission type, a bottom emission type, or a dual emission type according to the materials forming the pixel electrode 131 and the common electrode 135. In the present embodiment, the organic light emitting diode display 100 may be the top emission type in which the organic light emitting diode 13 emits light in the direction of the encapsulation substrate 20, thereby displaying images.

An example of the transparent conductive materials may include materials such as ITO (Indium Tin Oxide), IZO (Indium Zinc Oxide), ZnO (Zinc Oxide), etc. An example of the reflective materials and the transflective materials may include materials such as lithium (Li), calcium (Ca), fluoride lithium/calcium (LiF/Ca), fluoride lithium/aluminum (LiF/Al), aluminum (Al), silver (Ag), magnesium (Mg), gold (Au), etc.

The encapsulation substrate 20 may be disposed to be opposite on the common electrode 135. For example, the encapsulation substrate 20 may be disposed to be opposite to the display substrate 10, such that it covers the thin film transistor 12 and the organic light emitting diode 13, etc., so that they are sealed from the external elements. The display substrate 10 and the encapsulation substrate 20 may be bonded and sealed to each other through the sealing member 16 disposed along the edge of the display substrate 10 and the encapsulation substrate 20. Herein, the sealing member 16 may be formed from frit.

Figure 4:
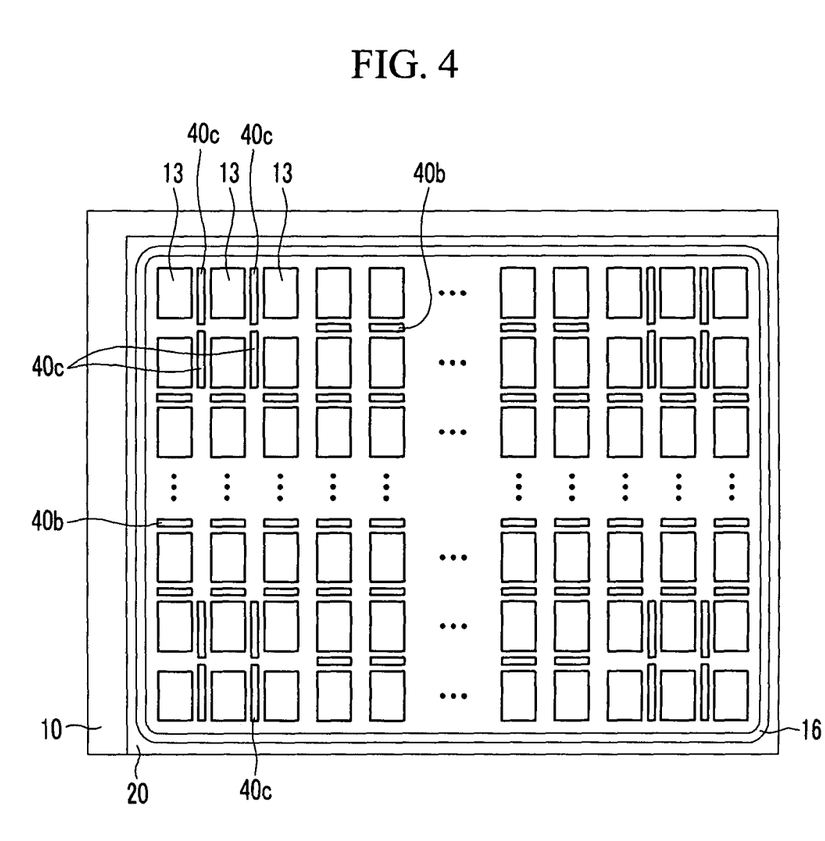
FIG. 4 illustrates a plan view showing an arrangement of spacers of an organic light emitting diode display according to a second example embodiment.

FIG. 4 illustrates a plan view showing an arrangement of spacers of an organic light emitting diode display according to a second example embodiment. Reference numerals that are the same as those shown in FIGS. 1 to 3 refer to the same members perform the same functions as described above in connection with FIGS. 1 to 3. Accordingly, a detailed description of the same reference numerals will not be repeated below.

Referring to FIG. 4, spacers 40c according to the second example embodiment may be disposed at four edges of the display substrate 10, respectively. The spacers 40c may be disposed in a column direction between the organic light emitting diodes 13.

The spacers 40c may be formed to be longer than the spacers 40b positioned at the central portion of the display substrate 10. Thus, the spacers 40c positioned at the edges of the display substrate 10 may be prevent the filling defect of the filler 30 filled at the edges of the display substrate 10, similar to the first example embodiment.

Figure 5:
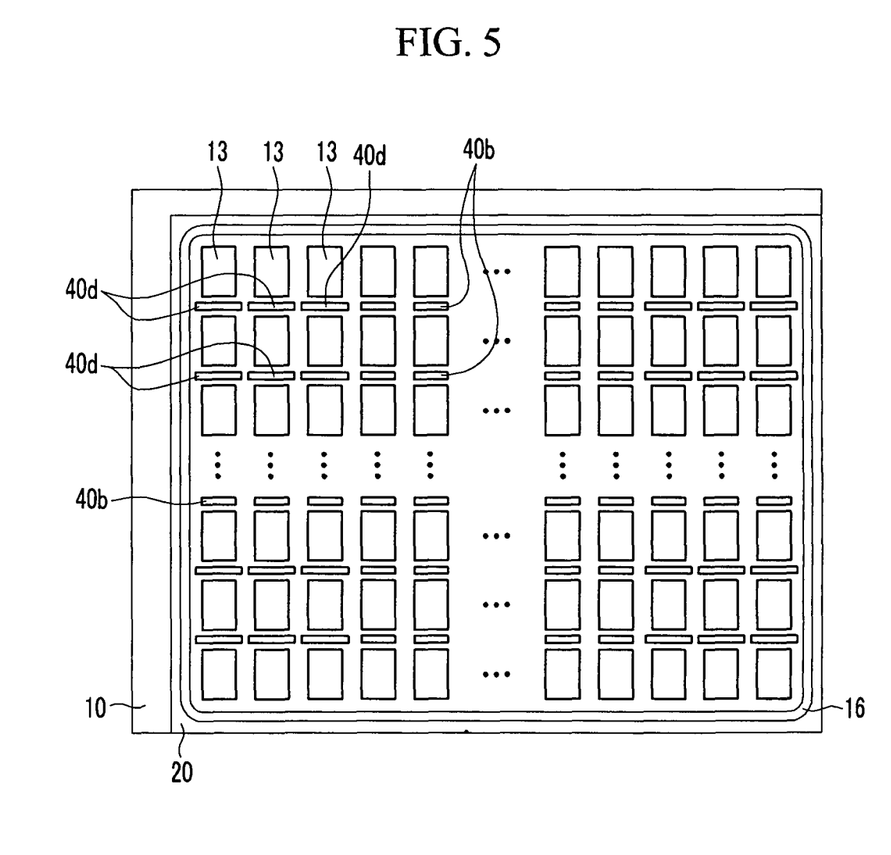
FIG. 5 illustrates a plan view showing an arrangement of spacers of an organic light emitting diode display according to a third example embodiment.

FIG. 5 illustrates a plan view showing an arrangement of spacers of an organic light emitting diode display according to a third example embodiment. Reference numerals that are the same as those shown in FIGS. 1 to 3 refer to the same members perform the same functions as described above in connection with FIGS. 1 to 3. Accordingly, a detailed description of the same reference numerals will not be repeated below.

Referring to FIG. 5, the spacers 40d according to the third example embodiment may be disposed at four edges of the display substrate 10, respectively. The spacers 40d may be disposed in a row direction between the organic light emitting diodes 13. Thus, the third example embodiment may achieve the same effect as the foregoing example embodiments.

Figure 6:
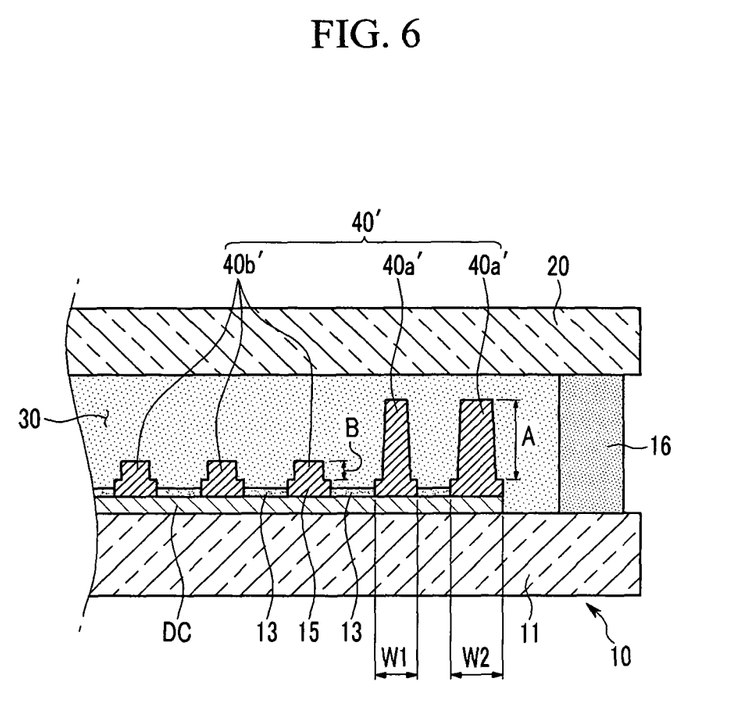
FIG. 6 illustrates a schematic cross-sectional view of an organic light emitting diode display according to another embodiment.

FIG. 6 illustrates a schematic cross-sectional view of an organic light emitting diode display according to another embodiment. Referring to FIG. 6, an organic light emitting diode display 100 according to the present embodiment may include the first substrate 10 (display substrate), a plurality of organic light emitting diodes (OLEDs) 13, the second substrate 20 (encapsulation substrate), the sealing member 16, the filler 30, and a plurality of protruding portions 40a', 40b' (collectively referred to as protruding portions 40'). The display substrate 10 may include the substrate main body 11, the driving circuit unit (DC) on the substrate main body 11, the OLEDs 13, and the pixel defining layer 15. The driving circuit unit (DC) may be formed on the substrate main body 11. The substrate main body 11 may be formed of, e.g., an insulating substrate made of glass, quartz, ceramic, plastic, etc. However, the first example embodiment is not limited thereto and the substrate main body 11 may be formed of a metallic substrate made of, e.g., stainless steel, etc.

In the present embodiment, the protruding portions 40b' may be the same as the protruding portions 40b above. The spacers 40a' may have a relatively larger volume as they approach the edges of the display substrate 10, which may prevent the diffusion defect of the filler 30 (which is filled between the display substrate 10 and the encapsulation substrate 20) at the edges of the display substrate 10. As shown in FIG. 6, the protruding portions 40a' may have a same height 'A' while having respectively different widths. For example, the protruding portions 40a' may have a relatively smaller width W1 (inner spacer 40a' in FIG. 6) and a relatively larger width W2 (outer spacer 40a' in FIG. 6), thus having respectively different volumes (W2 corresponding to a relatively larger volume that W1).

If an empty space exists between the display substrate and the encapsulation substrate, there may be a problem in that the mechanical strength of the organic light emitting diode display becomes weak. A general method of improving the durability of the organic light emitting diode display includes filling the space between the display substrate and encapsulation substrate with a filler using a vacuum bonding scheme. However, the filler may not be smoothly filled in the edge portions of the display substrates, such that the empty space may occur and the mechanical strength of the organic light emitting diode display may not be improved. In contrast, as described above, the organic light emitting diode display according to an embodiment may have a large volume of spacers at four edges of the display substrate, and/or have a greater number of spacers, to prevent the empty space from occurring due to the filling defect of the filler, thereby making it possible to improve the mechanical strength of the organic light emitting diode display. An organic light emitting diode display according to an example embodiment may include a first substrate including a plurality of organic light emitting diodes and a pixel defining layer having an opening portion defining a light emitting region of the organic light emitting diode, a second substrate disposed to be opposite to the first substrate, a sealing member bonding the first substrate to the second substrate, and filler positioned in a space between the first substrate and the second substrate, wherein a protruding portion protruded at an edge of the first substrate is provided on the pixel defining layer.

DESCRIPTION OF SYMBOLS

| | |
|---|---|
| 10: Display substrate | 11: Substrate main body |
| 13: Organic light emitting diode | 15: Pixel defining layer |
| 16: Sealing member | 17: Opening portion |
| 20: Encapsulation substrate | 30: Filler |
| 40: Spacer | |

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light emitting diode display, comprising:
    a first substrate, the first substrate including at least one organic light emitting diode, a pixel defining layer having an opening portion defining a light emitting region of the organic light emitting diode, and spacers protruding from the pixel defining layer, the spacers increasingly protruding-en from the pixel defining layer as the spacers approach corner regions of the first substrate such that spacers protruding from the pixel defining layer at corner regions of the pixel defining layer have a greater volume than spacers protruding from the pixel defining layer at all other regions of the pixel defining layer;

wherein the all other regions of pixel defining layer include peripheral edge regions of the first substrate between the corner region;

a second substrate disposed opposite to the first substrate;

a sealing member bonding the first substrate to the second substrate; and filler in a space between the first substrate and the second substrate.

2. The organic light emitting diode display as claimed in 1, wherein the spacers are configured to maintain an interval between the first substrate and the second substrate.

3. The organic light emitting diode display as claimed in claim 2, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being disposed in a row direction or a column direction between the organic light emitting diodes in the corner regions.

4. The organic light emitting diode display as claimed in claim 2, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being formed in a cross shape between the organic light emitting diodes in the corner regions.

5. The organic light emitting diode display as claimed in claim 2, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being formed in a combination of a cross shape and a straight shape between the organic light emitting diodes in the corner regions.

6. The organic light emitting diode display as claimed in claim 2, wherein the spacers have a longer length as they approach the corner regions of the first substrate.

7. The organic light emitting diode display as claimed in claim 6, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being disposed in a row direction or a column direction between the organic light emitting diodes in the corner regions.

8. The organic light emitting diode display as claimed in claim 6, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being formed in a cross shape between the organic light emitting diodes in the corner regions.

9. The organic light emitting diode display as claimed in claim 6, wherein:

the first substrate includes a plurality of organic light emitting diodes, the organic light emitting diodes being arranged in a plurality of rows and columns on the first substrate, and the spacers include spacers having a first volume and spacers having a relatively larger volume than the first volume, the spacers having the relatively larger volume being present only at the corner regions of the first substrate and being formed in a combination of a cross shape and a straight shape between the organic light emitting diodes in the corner regions.

10. The organic light emitting diode display as claimed in claim 1, wherein the spacers are integrally formed with the pixel defining layer.

11. The organic light emitting diode display as claimed in claim 1, wherein the sealing member is frit.

* * * * *